US006716738B2

(12) United States Patent
Kim et al.

(10) Patent No.: US 6,716,738 B2
(45) Date of Patent: Apr. 6, 2004

(54) METHOD OF FABRICATING MULTILAYERED UBM FOR FLIP CHIP INTERCONNECTIONS BY ELECTROPLATING

(75) Inventors: Su Hyeon Kim, Daejeon (KR); Jong Yeon Kim, Daejeon (KR); Jin Yu, Daejeon (KR)

(73) Assignee: Korea Advanced Institute of Science and Technology, Taejeon (KR)

( * ) Notice: Subject to any disclaimer, the term of this patent is extended or adjusted under 35 U.S.C. 154(b) by 0 days.

(21) Appl. No.: 10/232,471

(22) Filed: Aug. 30, 2002

(65) Prior Publication Data

US 2004/0018660 A1 Jan. 29, 2004

(30) Foreign Application Priority Data

Jul. 27, 2002 (KR) .......................................... 2002-44442

(51) Int. Cl.[7] .............................................. H01L 21/44
(52) U.S. Cl. ........................ 438/612; 438/613; 438/614
(58) Field of Search ................................. 438/612–614

(56) References Cited

U.S. PATENT DOCUMENTS

| 5,937,320 A | * | 8/1999 | Andricacos et al. | ......... 438/614 |
| 6,413,851 B1 | * | 7/2002 | Chow et al. | ................ 438/613 |
| 6,452,270 B1 | * | 9/2002 | Huang | ........................ 257/738 |
| 6,548,898 B2 | * | 4/2003 | Matsuki et al. | ............. 257/746 |

* cited by examiner

Primary Examiner—John F. Niebling
Assistant Examiner—Angel Roman
(74) Attorney, Agent, or Firm—Roberts Abokhair & Mardula, LLC

(57) ABSTRACT

Disclosed is a fabrication method of UBM for flip chip interconnections of a semiconductor device, consisting of dipping a patterned wafer into a plating solution containing materials supplying nickel and copper ions, forming a copper layer at a predetermined current density for connection between a chip pad and a solder bump and for residual stress-buffering, and forming a nickel-copper alloy layer at an increased current density for prevention of diffusion between the solder and the pad. The method is advantageous in terms of low fabrication cost due to not requiring an etching process, while meeting the conditions of wettability, diffusion-barrier function and small residual stress required to form UBM on the patterned wafer.

14 Claims, 4 Drawing Sheets

(a) 12 11

(b)

(c)

(d)

METHOD OF FABRICATING MULTILAYERED UBM FOR FLIP CHIP INTERCONNECTIONS BY ELECTROPLATING

CROSS REFERENCE TO OTHER PATENT APPLICATIONS

This application claims priority from Korean Patent Application No. 2002-0044442 filed on Jul. 27, 2002.

BACKGROUND

The present invention pertains, in general, to fabrication methods of UBM (under bump metallurgy) for flip chip interconnections of semiconductor devices, and in particular, to a method of fabricating the desired UBM by controlling current density during electroplating and without using an etching process.

Generally, as interconnection techniques between a semiconductor integrated circuit chip and a substrate, there have been employed the processes of flip chip, wire bonding and TAB (tape automated bonding). Of them, the flip chip process is advantageous in terms of high-speed and high density connections due to higher connection density and shorter connection distance, compared to the others. As for the flip chip interconnections, a UBM layer is bonded to a pad (aluminum or copper) of the chip, after which UBM is further bonded to a conductive solder bump. The bump-formed chip functions to bond the solder bump and the metal layer on the substrate, whereby electric signal transmission between the chip and the substrate can be accomplished. As such, a mechanical bonding is practicable. UBM provides good adhesion between the solder and the pad of the chip eliminates much of the mutual diffusion between the solder and the substrate.

Such a flip chip connection technique was devised for the first time by IBM in the 1960s. The fabrication method of those days comprised forming UBM with chromiun/chromium-copper alloy/copper layers on the chip pad by evaporation and then forming Sn-95% Pb solder bumps thereon by evaporation. In such a structure, the chromium layer is provided to be bonded to the pad, and the chromium-copper alloy layer prevents mutual diffusion of the solder and the pad. In addition, the copper layer is introduced to increase bondability and wettability with the solder. The above method, excellent in reliability, has been used for a considerable period. However, in typical electronic parts, the solder of 63% Sn-37% Pb having higher Sn content is mainly used, compared to Sn-95% Pb solder. In recent years, the process trended toward using environmentally safe materials, such as a Pb-free solder. Many problems are caused in the flip chip process including the finding that the UBM structure cannot effectively prevent the diffusion between the solder and the pad upon use with 63–37% Pb process solder and Pb-free solder, and in particular, Pb-free solder. Many researchers are working on UBM suitable for use with Pb-free solder, using sputtering, electroplating and electroless plating methods.

Most Pb-free solders developed until now have a large amount of tin. The Pb-free solder materials, suitable for use in the flip chip interconnections, are exemplified by Sn-3.5% Ag, Sn-0.7% Cu, and Sn-3.8% Ag-0.7% Cu. These materials contain 95% or more of Sn. Since the tin element rapidly reacts with copper, tin in the solder reacts with copper of UBM by heat generated in the course of reflow of the flip chip or use of the chip. Thus, an intermetallic compound is formed at the interface of UBM and the solder, and the copper is self-extinguished. If the intermetallic compounds are excessively formed or the copper layer in the UBM is completely self-extinguished, bonding strength between the solder and the pad is drastically decreased. Hence, UBM for use with Pb-free solder having high Sn content requires a novel diffusion barrier. In this regard, nickel is used. Nickel is slower in reaction rate with tin than copper. Until now, there have been proposed various processes for the formation of the diffusion barrier made of nickel or nickel alloy through sputtering, electroplating and electroless plating methods. However, the UBM structure including the nickel layer suffers from the problems related with poor solderability of nickel and residual stress in the nickel layer. In this regard, since nickel is low in wettability and bondability with the solder, it should be coated with gold or copper to obtain sufficient wettablity. Also, different from the copper layer, the nickel layer has high residual stress due to intrinsic properties of nickel and processing characteristics of the plating process. In the case where nickel is applied to UBM of silicone chip, the silicone chip may be cracked due to residual stress in UBM containing the stressed nickel. So, the residual stress in the UBM layer or thickness thereof should be decreased to prevent such cracks. However, if the thickness of the UBM is excessively reduced, the UBM layer may be completely self-extinguished upon the interfacial reaction with the solder. Therefore, the thickness of the UBM layer should be maintained at a predetermined level.

UBM for use with Pb-free solder in flip chip interconnections should meet requirements such as good wettablility and bondability with the solder, slow reaction with the solder to prevent the diffusion between the solder and the chip pad, and low residual stress not to cause cracks of the chip. With the aim of exhibiting the above requirements, the UBM structure comprises the multilayered structure as in the following Table 1.

TABLE 1

| Lower Layer | Al, Cr or Ti |
| --- | --- |
| Intermediate Layer 1 | Al or Cu |
| Intermediate Layer 2 | Ni or Ni alloy |
| Upper Layer | Au or Cu |

The lower layer made of aluminum, chromium or titanium is responsible for maintenance of bondability with the pad of the chip, and the intermediate layer 1 formed of aluminum or copper decreases the residual stress in UBM. The intermediate layer 2 formed of nickel or nickel alloys prevents diffusion, and the upper layer made of gold or copper provides wettability with the solder.

As representative UBM structures for flip chips, there are chromium/copper-chromium alloy/copper, titanium-tungsten alloy/copper/electrolytic copper, aluminum/nickel-vanadium alloy/copper, electroless nickel-phosphorus alloy/gold. Of them, chromium/copper-chromium alloy/copper structure, which was developed by IBM, is known not to be used with the Pb-free solder. In the structure of titanium-tungsten alloy/copper/electrolytic copper developed for use with Sn-37% Pb solder, the higher the Sn content as in the Pb-free solder, the thicker the electrolytic copper layer. Thus, the above structure has high residual stress and cannot be used. In the case of aluminum/nickel-vanadium alloy/copper structure developed to use with Pb-free solder by Delco, the nickel-vanadium layer is known to be slow in reaction with the Pb-free solder, but the used sputtering method requires an etching process, and suffers from higher process cost, compared to electroplating method. The structure of electroless nickel-phosphorus alloy/gold is advantageous in low fabrication cost but has the disadvantage of brittleness of the electroless nickel layer upon reaction with the Pb-free solder.

SUMMARY OF THE INVENTION

Therefore, it is an object of the present invention to solve the problems in the prior art and to provide a method of fabricating multi-layered UBM having a copper/nickel-copper alloy/copper structure via electroplating.

In accordance with one embodiment, the present invention provides a method of fabricating UBM for flip chip interconnections of a semiconductor device. The method comprises dipping a patterned wafer into a plating solution containing a material source of nickel and copper ions. A copper layer is formed at a predetermined current density for connection between a chip pad and a solder bump. The copper layer is of sufficient thickness to provide residual stress-buffering on the wafer. A nickel-copper alloy layer is formed, at an increased current density, and having sufficient thickness for prevention of mutual diffusion between the solder and the pad on the copper layer. Another copper layer is optionally formed on the nickel-copper alloy layer at a decreased current density for improvement of wettability with the solder. The ratio of the current density required to form the copper layer and the nickel-copper layer preferably ranges from 1:2.5 to 1:10.

The material source of supplying the nickel ion include $NiSO_4$, $NiCl_2$, $Ni(SO_3NH_2)_2$, and combinations thereof. The material source of supplying the copper ion include $CuSO_4$, $CuCN$, $Cu_2P_2O_7$ and combinations thereof.

BRIEF DESCRIPTION OF THE DRAWINGS

FIGS. 1a to 1d are schematic views for illustrating an embodiment of the present invention directed to a fabrication process of UBM comprising a copper/nickel-copper/copper structure, in which:

FIG. 1a shows a step of sequentially forming an adhesion layer and a copper seed layer 13 on a pad 12 of a wafer chip 11, and a patterned form with a photoresist 14;

FIG. 1b shows a step of forming a copper layer 15 on the seed layer via electroplating, and its plating conditions;

FIG. 1c shows a step of forming a nickel-copper layer 16 on the copper layer via electroplating, and its plating conditions;

FIG. 1d shows a step of forming another copper layer 17 on the nickel-copper layer via electroplating, and its plating conditions;

DETAILED DESCRIPTION OF THE INVENTION

Figure 1:
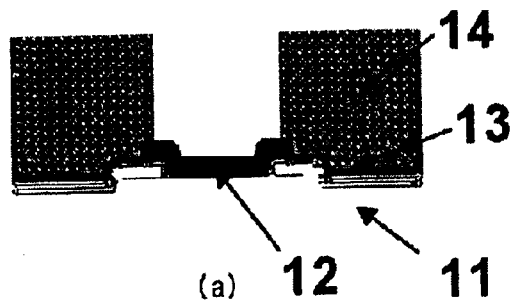
Figure 1:
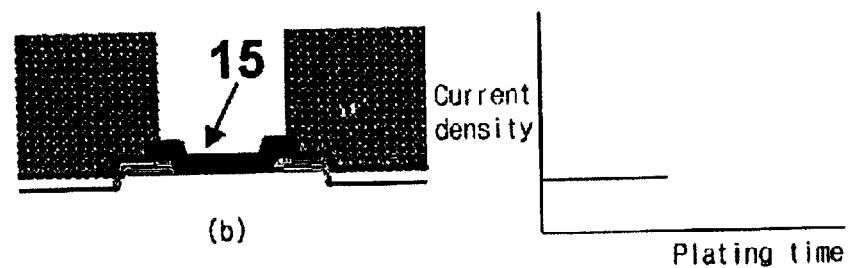
Figure 1:
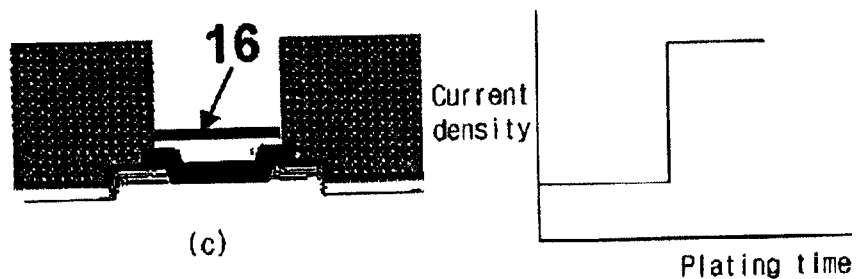
Figure 1:
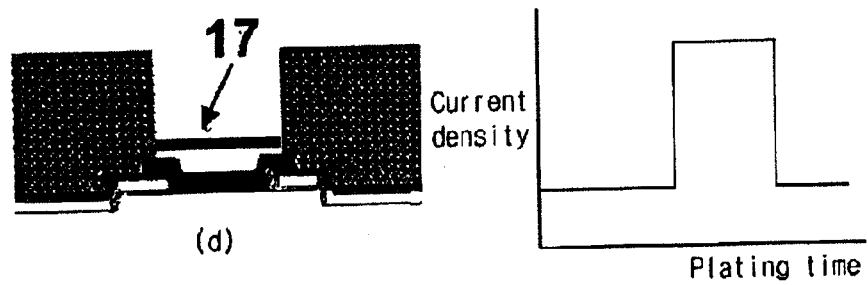

The present invention provides a method of fabricating UBM for flip chip interconnections of a semiconductor device, comprising the steps of dipping a patterned wafer into a plating solution containing a material of supplying nickel and copper ions, forming a copper layer at a predetermined current density for connection between a chip pad and a solder bump and for residual stress-buffering on the wafer, and forming a nickel-copper alloy layer at an increased current density for prevention of mutual diffusion between the solder and the pad on the copper layer.

The method of the present invention further comprises the step of forming another copper layer at a decreased current density for improvement of wettability with the solder on the nickel-copper alloy layer.

The UBM fabrication method of the present invention is characterized in that the desired UBM can be formed under control of current density, without using an etching process, by dipping the predetermined pattern-formed wafer into the plating solution containing materials supplying nickel and copper ions.

The materials usable as the sources of nickel and copper ions include any ones which can be commonly used for electroplating techniques, and are not limited to specific kinds of materials. The material source of the nickel ion is exemplified by $NiSO_4$, $NiCl_2$, $Ni(SO_3NH_2)_2$, and so on, and the examples of the material supplying the copper ion include $CuSO_4$, $CuCN$, $Cu_2P_2O_7$ and the like. The composition of the plating solution containing the above ion-supplying materials is apparent to those skilled in the art. So, according to the composition of the desirable plated layer, the concentration of nickel or copper ion can be increased or decreased.

The conditions of pH and temperature of the solution are not specifically limited. The following examples of the present invention are carried out under basic conditions, that is to say, pH 8.5–9.0, at 45–50° C. which is only a preferable illustration for performing the present invention and may be variously adjusted by those skilled in the art.

The current density applied during the electroplating process is an important factor. The alloy composition in the plated layer varies with the current density upon plating. At high current density, a nickel-copper alloy layer having high nickel content is obtained, whereas the copper content increases at lower current density and thus a pure copper layer is formed at current density less than a predetermined level.

A ratio of the current density required for formation of the pure copper layer and the alloy layer ranges from 1:2.5 to 1:10. The applied current density may vary with the specific composition and environment of the plating solution. As for the plating solution, the content of nickel or copper is determined experimentally.

Under plating conditions in the following Examples, the current density for formation of the copper layer is selected in the range of from 0.2–1 $A/dm^2$, and the current density for formation of nickel-copper alloy layer is in the range of from 0.3–4 $A/dm^2$.

Referring to the appended drawings, a description will be given of the formation method of UBM for flip chip interconnections, below.

As in FIG. 1a, chromium, Utanium or titanium-tungsten alloy layer 13 as an adhesion layer is thinly coated over the whole surface of a pad and passivation layer formed chip 11 through a sputtering method, which aims at bonding with the pad 12. Over the adhesion layer, the copper layer 13, functioning as a seed layer of electroplating of UBM, is thinly coated by the sputtering method, after which the portions that will be formed to a UBM layer and a solder are patterned with the photoresist 14. The patterned wafer is dipped into the plating solution having the composition shown in the Table 2, below, thus performing UBM plating.

TABLE 2

Composition and Condition of Plating Solution

| Composition | |
|---|---|
| NiSO$_4$6H$_2$O | 0.3 M |
| CuSO$_4$6H$_2$O | 0.04 M |
| Na citrate | 0.2 M |
| Condition | |
| pH | 9 |
| Plating Temp. | 50° C. |
| Cathode | Tin |
| Stirring | No |

Sodium citrate is provided as a complex functioning to concurrently plate copper and nickel.

At low current density for plating only copper on the pad of the patterned water, the plating process is carried out, and the pure copper layer 15 having a predetermined thickness is formed on the pad of the wafer (see FIG. 1b). The copper layer 15 is responsible for connecting the pad of the chip and the solder bump to each other and to decrease residual stress in the UBM structure. The current density is increased immediately after the above plating process is performed, to form the nickel-copper alloy layer 16 over the copper layer 15 (see FIG. 1c). As such, there is no change of other plating conditions, aside from change of current density. Also, the plating process is continuously performed in the same plating solution and the processing rate is fast. The formed nickel-copper alloy layer 16 acts to prevent mutual diffusion between the solder and the pad. Then, the current density is decreased, and another pure copper layer 17 is formed on the nickel-copper alloy layer (see FIG. 1d). Such a copper layer 17 confers wettability and bondability to the solder. Provided that wettability of the nickel-copper layer 16 is sufficient, the topmost copper layer 17 may not be formed.

Figure 2:
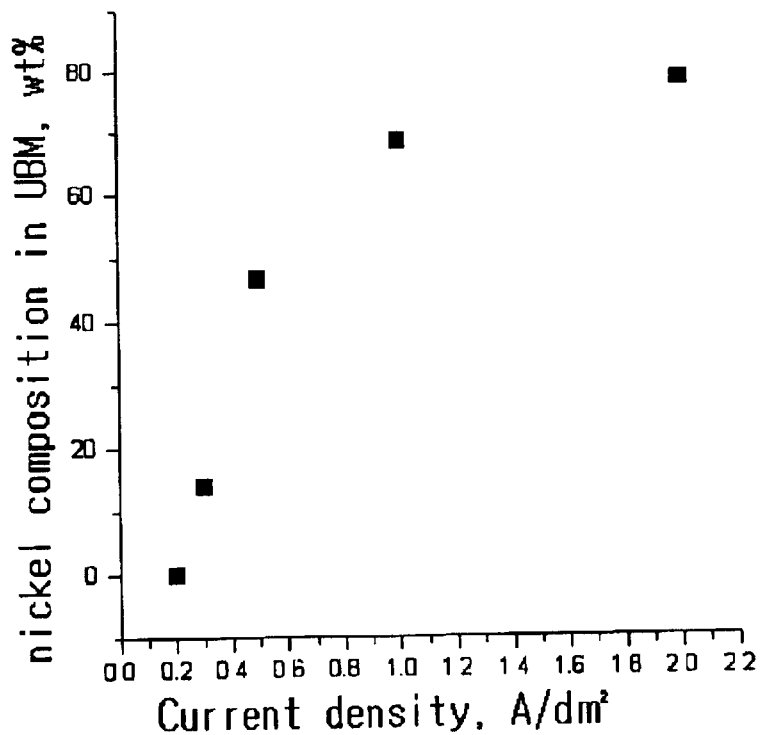
FIG. 2 is a graph showing a composition of the nickel-copper alloy layer varying with current density upon electroplating according to one embodiment of the present invention.

With reference to FIG. 2, there is shown the composition of the nickel-copper alloy layer 16 varying with current density under the above plating conditions. Only by controlling the current density, the pure copper layers 15 and 17, and the nickel-copper layer 16 can be plated in the same plating bath. The nickel-copper layer 16 may be variously regulated in its composition.

Figure 3:
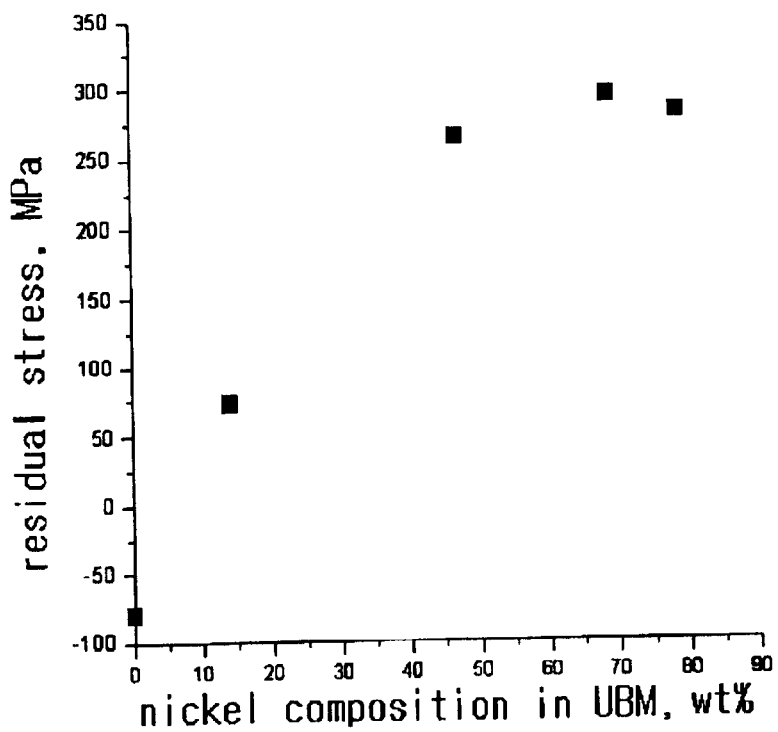
FIG. 3 is a graph showing residual stress varying with the composition of the nickel-copper alloy layer formed by electroplating according to one embodiment of the present invention.

The residual stress in the nickel-copper layer 16 obtained by electroplating varies with the layer composition, in which the copper is commonly small in the residual stress. FIG. 3 shows the residual stress according to the composition of the plated layer when the plating process is performed under the above conditions. The higher the copper content in the plated layer, the lower the residual stress. Pure copper has very small residual compressive stress. Thus, the lower copper layer 15 effectively buffers residual tensile stress by absorbing and offsetting the residual stress in the copper-nickel layer 16.

In order to find whether the nickel-copper layer 16 functions as a diffusion barrier in the UBM structure, Sn-3.5% Ag solder was applied onto the nickel-copper alloy layer and reflow was performed at 250° C., and the interfacial reaction was observed (control: pure nickel plated layer). During reflow, the nickel-copper alloy layer reacts with the solder and is self-extinguished, thereby forming an intermetallic compound.

Figure 4:
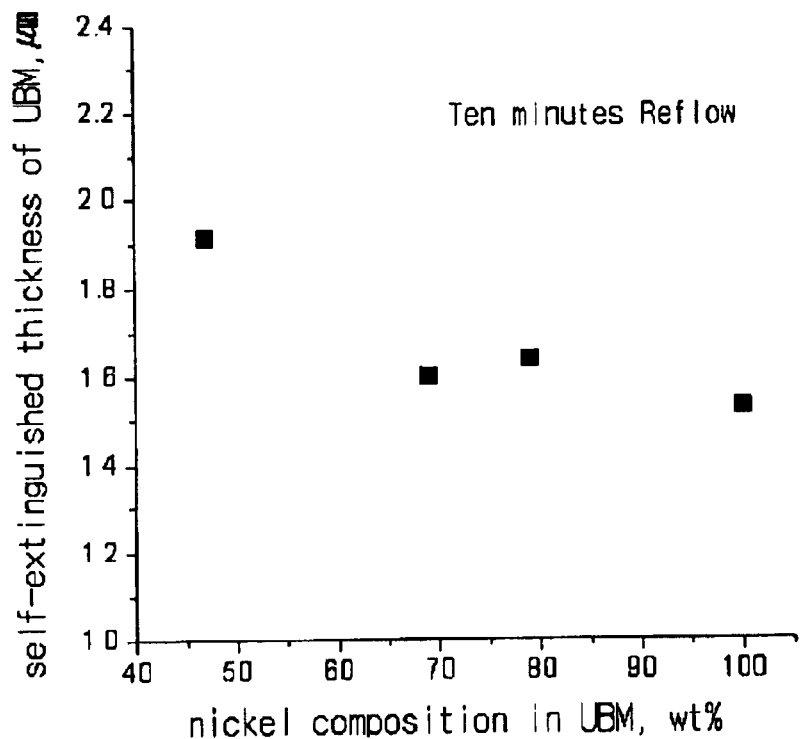
FIG. 4 is a graph showing the self-extinguished degree of the nickel-copper layer after solder reflow, based on the above layer composition in UBM formed by electroplating according to one embodiment of the present invention.

FIG. 4 shows the self-extinguished degree of the nickel-copper alloy layer and the nickel layer after solder reflow. The nickel-copper alloy has the nickel content ranging from 100% to 47%. Even in the nickel-copper layer having the nickel content decreased up to 47%, the self-extinguished degree by reaction with the solder is not larger than that of pure nickel layer.

In practical flip chip processes, a reflowing process is carried out for several minutes. Thus the self-extinguished degree of the nickel-copper alloy shown in FIG. 4 is standardized and the thickness of UBM can be determined. High nickel content is preferable for decrease of the thickness of UBM.

Having generally described this invention, a further understanding can be obtained by reference to certain specific examples which are provided herein for purposes of illustration only and are not intended to be limiting unless otherwise specified.

The invention is illustrated, but not limited by the following examples:

EXAMPLE 1

UBM Having Copper/Nickel-copper Alloy Structure

As in the following samples, UBM having a copper layer/nickel-copper alloy layer structure was fabricated, while altering the thickness of the copper layer. In addition, residual stress change was observed in accordance with the thickness of the copper layer.

Sample 1: a 4 μm thick nickel-30% copper alloy layer without formation of a pure copper layer, produced by performing a plating process at a current density of 1 A/dm$^2$ for 20 minutes in the plating solution shown in the above Table 2;

Sample 2: a 1 μm thick copper layer produced by a plating process under conditions of current density of 0.2 A/dm$^2$ for 25 minutes, and a 3 μm thick nickel-30% copper alloy layer formed thereon by performing a plating process at a current density of 1 A/dm$^2$ for 15 minutes;

Sample 3: a 2 μm thick copper layer produced by performing a plating process at a current density of 0.2 A/dm$^2$ for 50 minutes, and a 2 μm thick nickel-30% copper alloy layer formed thereon by carrying out a plating process at a current density of 1 A/dm$^2$ for 10 minutes;

Sample 4: a 3 μm thick copper layer produced by plating process under conditions of the density of 0.2 A/dm$^2$ for 75 minutes, and a 1 μm thick nickel-30% copper alloy layer formed thereon by a plating process under conditions of current density of 1 A/dm$^2$ for 5 minutes.

Figure 5:
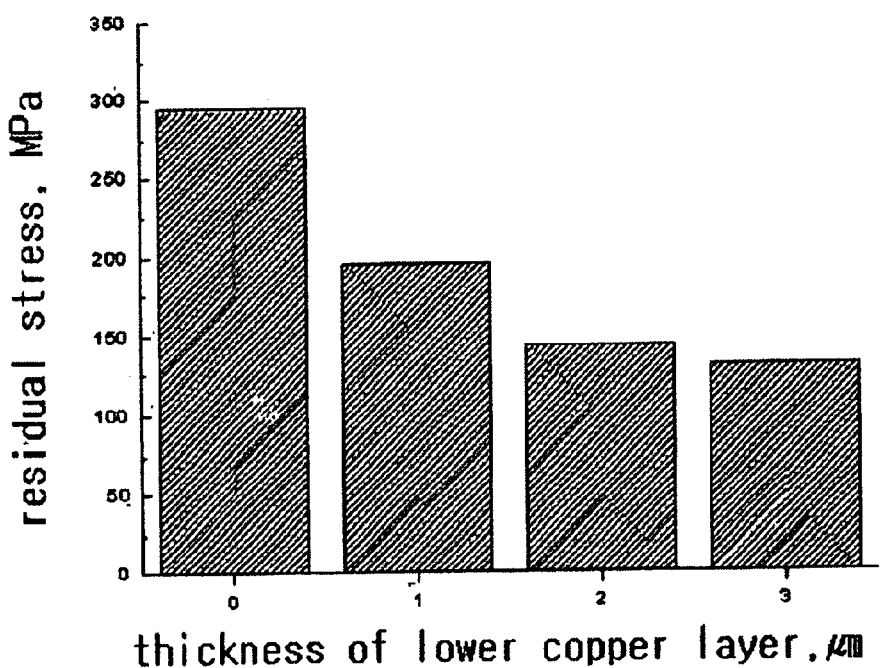
FIG. 5 is a graph showing residual stress varying with the thickness of the lower copper layer in UBM formed by electroplating according to one embodiment of the present invention.

From the graph of FIG. 5 showing the measured residual stress in each sample, it can be seen that the residual stress in UBM is decreased by increase of thickness of the pure copper layer.

Therefore, it can be seen that the residual stress in UBM, variable by the thickness of the lower copper layer, can be maintained in less than a predetermined level due to formation of the copper layer having a proper thickness.

EXAMPLE 2

UBM Having Copper/Nickel-copper Alloy/Copper Structure I

Figure 6:
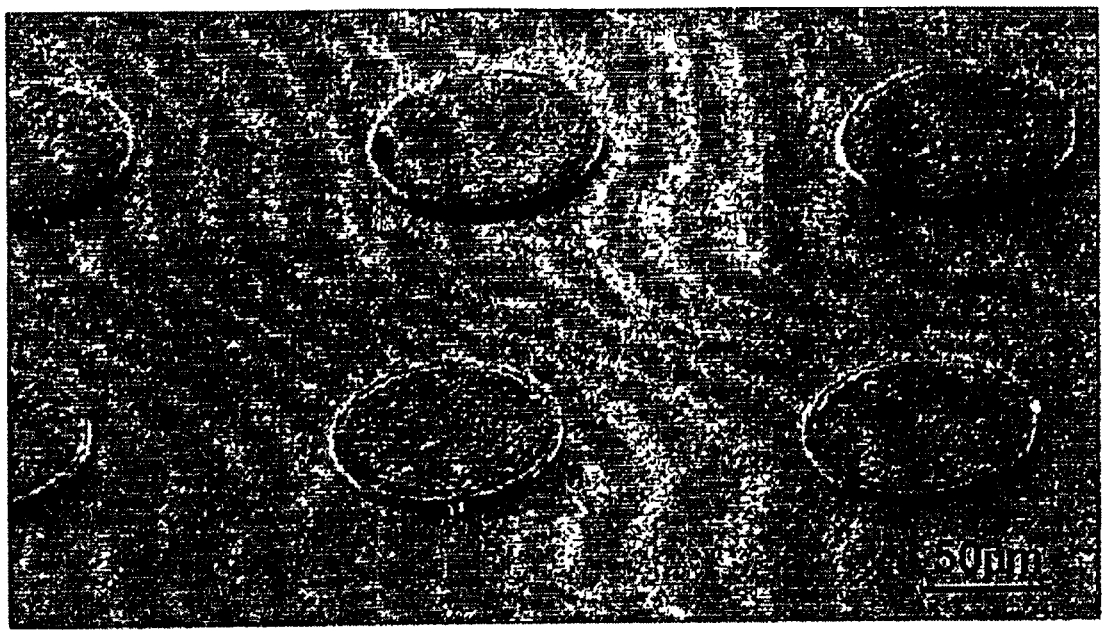
FIG. 6 is a photograph showing UBM comprising a copper/nickel-copper/copper structure in Example 2, taken by a scanning electron microscope.

Using the plating solution shown in the above Table 2, a plating process was performed at current density of 0.2 A/dm$^2$ for 50 minutes, to form a pure copper layer having 2 μm thickness, on which a 4 μm thick nickel-50% copper alloy layer was formed by a plating process at a current density of 0.5 A/dm$^2$ for 50 minutes. Thereafter, another pure copper layer being 0.2 μm thick was formed thereon by the plating process at 0.2 A/dm$^2$ for 5 minutes. A scanning electron microscopic photograph of thusly formed UBM is shown in FIG. 6 (photoresist is removed).

Since wettability of a Pb-free solder to the nickel-50% copper alloy layer is excellent, UBM of copper/nickel-copper structure may be formed without the topmost pure copper layer in UBM comprising copper/nickel-copper/copper structure.

EXAMPLE 3

UBM Having Copper/Nickel-copper Alloy/Copper Structure II

Figure 7:
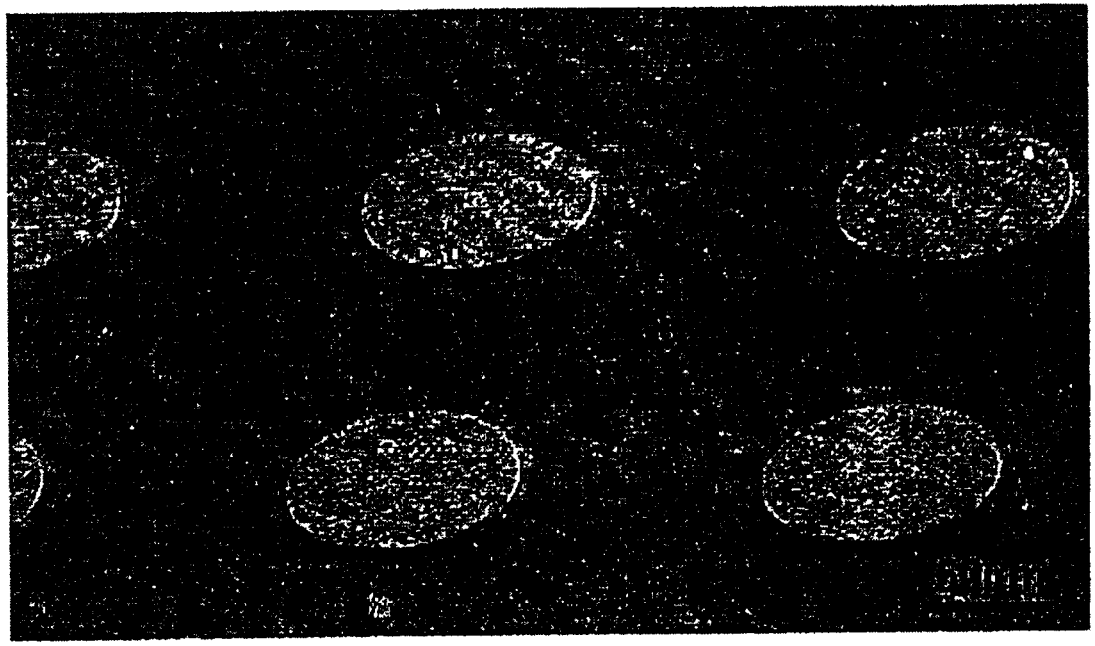
FIG. 7 is a photograph showing UBM comprising a copper/nickel-copper/copper structure in Example 3, taken by a scanning electron microscope.

On a wafer pad patterned with the photoresist using the plating solution shown in the above Table 2, a plating process was performed at an initial current density of 0.2 A/dm$^2$ for 25 minutes, to form a pure copper layer, which was then bonded to the pad. A nickel-30% copper alloy layer was formed by a plating process under the conditions of current density of 1 A/dm$^2$ for 20 minutes on the copper layer. Thereafter, another pure copper layer was further formed thereon by the plating process at 0.2 A/dm$^2$ for 5 minutes. With reference to FIG. 7, there is shown a scanning electron microscopic photograph of thusly formed UBM (photoresist is removed).

As described above, the method of the present invention is advantageous in light of low fabrication cost due to requiring no etching process, while meeting requirements upon formation of UBM on a patterned wafer, such as wettability, diffusion barrier function, and low residual stress. In addition, reliable UBM can be formed, applicable to Pb-free solders as well as conventional process solders.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Although the present invention has been described in terms of specific embodiments, various substitutions of materials and conditions can be made as will be known to those skilled in the art. For example, the nucleation system may be adjusted by using other nucleation agents. Other variations will be apparent to those skilled in the art and are meant to be included herein. The scope of the invention is only to be limited by the following claims:

What is claimed is:

1. A method of fabricating UBM for flip chip interconnections of a semiconductor device, comprising:
    dipping a patterned wafer into a plating solution containing a material source of nickel and copper ions;
    forming a copper layer at a predetermined current density for connection between a chip pad and a solder bump and for residual stress-buffering, on the wafer; and
    forming a nickel-copper alloy layer at an increased current density for prevention of mutual diffusion between the solder and the pad, on the copper layer.

2. The method as set forth in claim 1, further comprising the step of forming another copper layer at a decreased current density for improvement of wettability with the solder, on the nickel-copper alloy layer.

3. The method as set forth in claim 1, wherein a ratio of the current density required to form the copper layer and the nickel-copper layer ranges from 1:2.5 to 1:10.

4. The method as set forth in claim 3, wherein the current density applied to form the copper layer ranges from 0.2 to 1 A/dm$^2$.

5. The method as set forth in claim 3, wherein the current density applied to form the nickel-copper layer ranges from 0.3 to 4 A/dm$^2$.

6. The method as set forth in claim 1, wherein the material source of supplying the nickel ion is selected from among NiSO$_4$, NiCl$_2$, Ni(SO$_3$NH$_2$)$_2$, and combinations thereof.

7. The method as set forth in claim 1, wherein the material source of supplying the copper ion is selected from among CuSO$_4$, CuCN, Cu$_2$P$_2$O$_7$, and combinations thereof.

8. A method of fabricating UBM for flip chip interconnections of a semiconductor device, comprising:
    dipping a patterned wafer into a plating solution containing a material source of nickel and copper ions;
    using a predetermined first current to form a copper layer on the wafer for connection between a chip pad and a solder bump, wherein the copper layer is of sufficient thickness to provide residual stress-buffering; and
    using a higher second current to form a nickel-copper alloy layer on the copper layer having sufficient thickness to prevent damaging mutual diffusion between the solder bump and the pad.

9. The method as set forth in claim 8, further comprising application of a third lower current to form a copper layer on the nickel-copper alloy layer having sufficient thickness to improve wettability with the solder.

10. The method as set forth in claim 8, wherein a ratio of the current density required to form the copper layer and the nickel-copper layer ranges from 1:2.5 to 1:10.

11. The method as set forth in claim 8, wherein the material source of supplying the nickel ion is selected from the group of NiSO$_4$, NiCl$_2$, Ni(SO$_3$NH$_2$)$_2$, and combinations thereof.

12. The method as set forth in claim 8, wherein the material source of supplying the copper ion is selected from the group of CuSO$_4$, CuCN, Cu$_2$P$_2$O$_7$, and combinations thereof.

13. A method of fabricating UBM for flip chip interconnections of a semiconductor device, comprising:
    dipping a patterned wafer into a plating solution containing a material source of nickel and copper ions;
    using a predetermined first current to form a copper layer on the wafer for connection between a chip pad and a solder bump, wherein the copper layer has a thickness from 0.5 to 4 microns; and
    without removing the wafer from the plating solution, using a higher second current to form a nickel-copper alloy layer on the copper layer having a thickness from 0.5 to 4 microns and wherein the higher second current is at least twice the first lower current.

14. The method as set forth in claim 13, further comprising, without removing the wafer from the plating solution, application of a third lower current to form a copper layer on the nickel-copper alloy layer having sufficient thickness to improve wettability with the solder.

* * * * *